US011250178B2

(12) United States Patent
Livnat

(10) Patent No.: US 11,250,178 B2
(45) Date of Patent: Feb. 15, 2022

(54) DYNAMIC SPATIAL CLUSTERING CONSTRUCTION AND VISUALIZATION SYSTEM FOR OFFICE SPACE PLANNING AND OPTIMIZATION

(71) Applicant: SpaceIQ LLC, Mountain View, CA (US)

(72) Inventor: Noam Livnat, Mountain View, CA (US)

(73) Assignee: SpaceIQ LLC, Mountain View, CA (US)

(*) Notice: Subject to any disclaimer, the term of this patent is extended or adjusted under 35 U.S.C. 154(b) by 437 days.

(21) Appl. No.: 16/410,125

(22) Filed: May 13, 2019

(65) Prior Publication Data

US 2019/0347367 A1     Nov. 14, 2019

Related U.S. Application Data

(60) Provisional application No. 62/670,677, filed on May 11, 2018.

(51) Int. Cl.
*G06F 30/13*     (2020.01)
*G06Q 10/06*     (2012.01)
(Continued)

(52) U.S. Cl.
CPC ............ *G06F 30/13* (2020.01); *G06F 16/909* (2019.01); *G06Q 10/06313* (2013.01); *G06T 11/20* (2013.01)

(58) Field of Classification Search
CPC ........ G06F 30/13; G06F 16/909; G06F 30/17; G06F 1/16; G06Q 10/06313; G06Q 10/06;
(Continued)

(56) References Cited

U.S. PATENT DOCUMENTS 6,976,002 B1 * 12/2005 Ferguson ......... G06Q 10/06316
                                                                   705/7.26
9,785,727 B1 * 10/2017 Wilson ..................... G06F 30/17
(Continued)

FOREIGN PATENT DOCUMENTS

WO    WO 2017162550 A1 * 9/2017 ........... H05B 47/115
WO    WO 2017180033 A1 * 10/2017

OTHER PUBLICATIONS

Wikepedia, "Convex Hull Algorithm", Oct. 4, 2021.*
Google, Convex Hull Computation, Oct. 4, 2021.*

*Primary Examiner* — Kandasamy Thangavelu
(74) *Attorney, Agent, or Firm* — Goodwin Procter LLP

(57) ABSTRACT

A novel dynamic spatial clustering construction and visualization system is configured to intelligently and autonomously determine optimal office space divisions for improved space efficiency and/or productivity of an organization in a particular office floorplan. Instead of requiring a human operator intervention to input step-by-step instructions or floor plan map manipulations into the system, the dynamic spatial clustering construction and visualization system can autonomously and intelligently determine optimal spatial clustering from a given set of space segments, grouping properties, and geographic features of a computerized office floor plan, by machine-determined isolation and sub-grouping of space marker icons based on known common traits per icon, by determining separate clusters within each subgroup using a density-based clustering algorithm, by creating space marker boundary indicators to approximate required spaces without spatial waste, and by executing a convex hull algorithm on each defined cluster to define the new boundary per cluster without spatial waste.

10 Claims, 10 Drawing Sheets

The Sequential Walk-Through Example of Dynamic Spatial Clustering and Visualization - Continued
500C

(51) Int. Cl.
*G06T 11/20* (2006.01)
*G06F 16/909* (2019.01)

(58) Field of Classification Search
CPC .. G06Q 10/06316; G06Q 30/06; G06T 11/20; G06T 11/206; H04N 7/147; H04W 4/38
See application file for complete search history.

(56) References Cited

U.S. PATENT DOCUMENTS

| | | | |
|---|---|---|---|
| 9,955,318 B1* | 4/2018 | Scheper | H04W 4/38 |
| 10,404,938 B1* | 9/2019 | De Benoist | H04N 7/147 |
| 2002/0078459 A1* | 6/2002 | McKay | G06F 1/16 |
| | | | 725/78 |
| 2006/0036513 A1* | 2/2006 | Whatley | G06Q 30/06 |
| | | | 705/26.1 |
| 2008/0183483 A1* | 7/2008 | Hart | G06F 30/13 |
| | | | 705/1.1 |
| 2012/0317059 A1* | 12/2012 | Joshi | G06Q 10/06 |
| | | | 706/12 |
| 2013/0246108 A1* | 9/2013 | Nagy | G06F 30/13 |
| | | | 705/7.12 |

* cited by examiner

-Prior Art-

A Color-Coded Polylined Map in Conventional Office Space Management Solutions

100

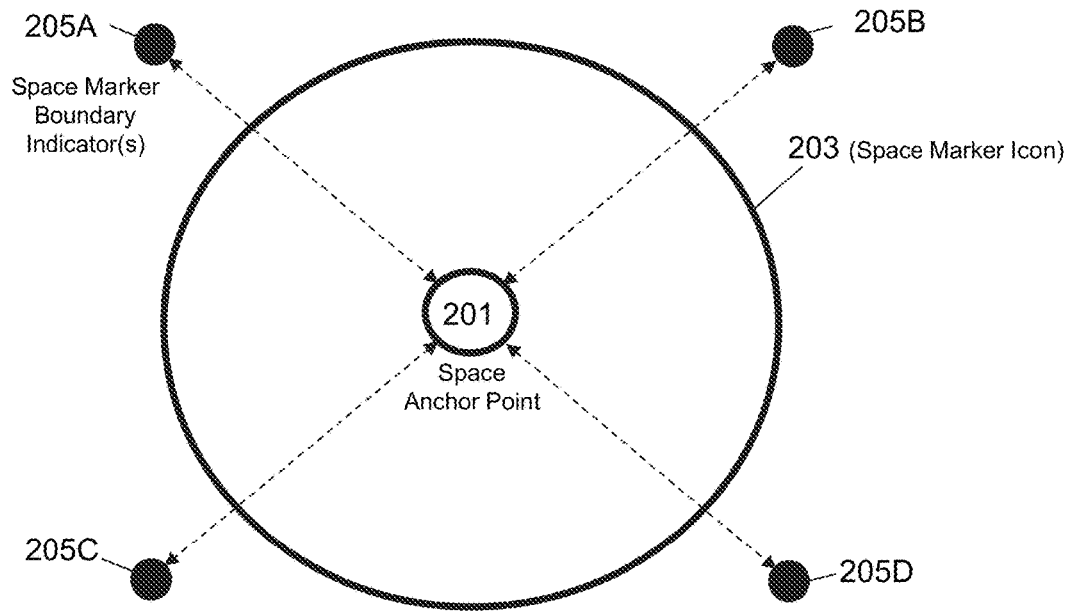

Centrally-Located Space Anchor Point and Dynamically-Adjustable Space Marker Icon Example

| Grouping Properties / Anchor Pt. # | Department Allocation | Current Space Type | Notable Spatial Features | Etc. |
|---|---|---|---|---|
| 201 | Engineering | Cubicles / Workstations | Adjacent to Atrium | |
| 202 | Marketing | Cubicles / Workstations | Adjacent to Kitchen and Atrium | |
| 205 | Engineering | Leaded Wall Laboratory | Adjacent to Stairs | |
| 301 | Human Resources | Conference Room | Wall-to-Wall Windows | |

Grouping Properties per Space Anchor Point

Dynamic Space Anchor Point Grouping Example in the Dynamic Spatial Clustering Construction and Visualization System

400

STEP 501

Floorplan spaces represented by round space marker icons. Icon colors / shades indicate a distinctive grouping property (e.g. black for Marketing Dept., white for Sales Dept., etc.)

STEP 502

Each set of objects with the same grouping property (e.g. desks belonging to the Marketing Dept. indicated with black round icons) is isolated from others A Sequential Walk-Through Example of Dynamic Spatial Clustering and Visualization

The Sequential Walk-Through Example of Dynamic Spatial Clustering and Visualization - Continued

500B

STEP 505 — New boundary of the cluster is identified using a convex hull algorithm, with automatically-optimized parameters

STEP 506 — The process is repeated for all groups and clusters, which are then displayed together.

The Sequential Walk-Through Example of Dynamic Spatial Clustering and Visualization - Continued

500C

Dynamic Spatial Clustering and Visualization Screenshot for an Office Floorplan with Clustering Visualization Turned Off (601A) or Turned On (601B)

600

1      Simple set of points in a Euclidean plane
2      Standard attempt to outline a cluster of these points.
3   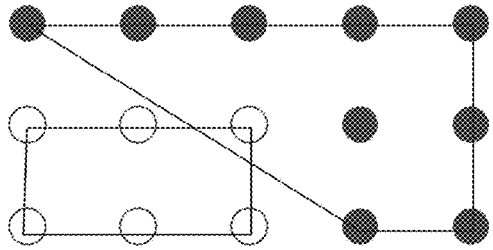   Typical seat cluster in an office environment. Visualization without this invention's process results in overlapping regions and unclear clusters.
Examples of Conventional (i.e. Prior Art) Node Grouping Methods with Notable Shortcomings
700
FIG. 7

Convex hull of a finite set: elastic-band analogy

Diagram Example Utilizing Convex Hull Algorithm to Generate an Outline of a Space Block Cluster

800

Operational Flowchart for a Dynamic Spatial Clustering Construction Process Executed by a Dynamic Spatial Clustering Construction and Visualization System

DYNAMIC SPATIAL CLUSTERING CONSTRUCTION AND VISUALIZATION SYSTEM FOR OFFICE SPACE PLANNING AND OPTIMIZATION

CROSS-REFERENCE TO RELATED APPLICATION

This application claims priority to U.S. Provisional Patent Application Ser. No. filed on 62/670,677, filed on May 11, 2018 the entire disclosure of which is incorporated by reference herein.

BACKGROUND OF THE INVENTION

The present invention generally relates to space optimization systems and methods. More specifically, the present invention relates to novel computer graphics construction, encoding, and visualization of machine-determined planning and optimization of physical spaces based on organizational characteristics of a space occupant and spatial characteristics specific to a floor layout.

Efficient physical space management has gained considerable importance in improving worker productivity and reducing unnecessary corporate office leasing costs in recent years. Space management is becoming an integral part of workplace management activities that involve identifying various spaces in a workplace, tracking various properties associated with such spaces, and allocating or assigning specific spaces to appropriate business units and individuals.

For example, an office floor plan, presented either on a printed paper or on a computer screen, may indicate a set of private offices, shared offices, cubicles, bench desks, storage rooms, lab rooms, meeting rooms, etc. Each of these spaces may be given an identifying number and/or a name, and allocated to a specific department or to an individual. For instance, "Lab Room 231" may be reserved for and used by the Oncology Department, while "Storage Room 423" may be reserved for and used by the Marketing Department Similarly, "Cubicle 445" and "Private Office 489" may be allocated to the Sales Department, which further assigns Cubicle 445 to a Sales Department employee and Private Office 489 to a Sales Department executive.

Conventionally, office space allocations are manual processes involving human-initiated determination of departmental and personnel space allocations, revisions, and re-assignments, as conditions of each organization change over time. Existing methods of creating and updating office space allocations involve paper or computer-aided floorplan drawing and color-coding by departments or personnel. Because these existing office space allocation and management methods typically involve sporadic and/or unsystematic human-initiated review and modifications to floorplans by the occupiers of the space, efficient and optimal space allocations, utilizations, and re-assignments remain elusive in a typical office space management environment in a commercial building.

Therefore, it may be desirable to provide a novel electronic system capable of intelligent machine determination of dynamic spatial allocation, clustering, and re-assignment of a particular office space in a synthesized computer visualization environment to improve workspace utilizations and organizational productivities.

Furthermore, it may also be desirable to provide a method of operating a novel electronic system capable of intelligent machine determination of dynamic spatial allocation, clustering, and re-assignment of a particular office space in a synthesized computer visualization environment to improve workspace utilization and organizational productivity.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a method for dynamic spatial clustering construction and visualization for office space planning of an organization is disclosed. This method comprises the steps of: (1) graphically rendering a plurality of space anchor points for a particular office floor plan in a synthesized computer visualization environment provided by a dynamic spatial clustering construction and visualization system; (2) identifying, determining, and associating each space anchor point with one or more grouping properties, based on organizational characteristics specific to a space occupant and spatial characteristics specific to a floor layout in the particular office floor plan; (3) creating groups from the plurality of space anchor points in the dynamic spatial clustering construction and visualization system based on user-specified desired grouping properties, wherein each group contains one or more space anchor points with common traits indicated by the user-specified desired grouping properties; (4) executing a density-based spatial clustering application in the dynamic spatial clustering construction and visualization system to identify one or more groups of nearby spaces and to determine an optimal "space block cluster" that represents a space-efficient and non-overlapping spatial clustering formation with the common traits within the organization, based on clustering radius arguments that include at least one of a space marker icon size and a scale of an image on the particular office floor plan; (5) superimposing or replacing a subset of the plurality of space anchor points contained in the one or more groups of nearby spaces with the optimal "space block cluster," which is graphically rendered as a rectangle or another computer graphical shape on a display panel connected to the dynamic spatial clustering construction and visualization system; (6) executing a convex hull algorithm in the dynamic spatial clustering construction and visualization system to determine a more detailed outline of the optimal "space block cluster," wherein one or more concavity parameters of the convex hull algorithm are utilized as a function of the scale of the image rendered as the optimal "space block cluster"; and (7) synthesizing and graphically rendering the more detailed outline of the optimal "space block cluster" as computerized graphics on the particular office floor plan in the synthesized computer visualization environment provided by the dynamic spatial clustering construction and visualization system.

BRIEF DESCRIPTION OF DRAWINGS

FIG. 2 shows an embodiment of a centrally-located space anchor point and a dynamically-adjustable space marker icon, in accordance with an embodiment of the invention.

FIG. 3 shows an example of grouping properties associated with each space anchor point for dynamic spatial clustering construction and visualization, in accordance with an embodiment of the invention.

FIGS. 5A-5C show a sequential walk-through example of dynamic spatial clustering and visualization, in accordance with an embodiment of the invention.

FIG. 7 shows examples of conventional (i.e. prior art) node-grouping methods with some notable shortcomings, in accordance with an embodiment of the invention.

DETAILED DESCRIPTION

Figure 1:
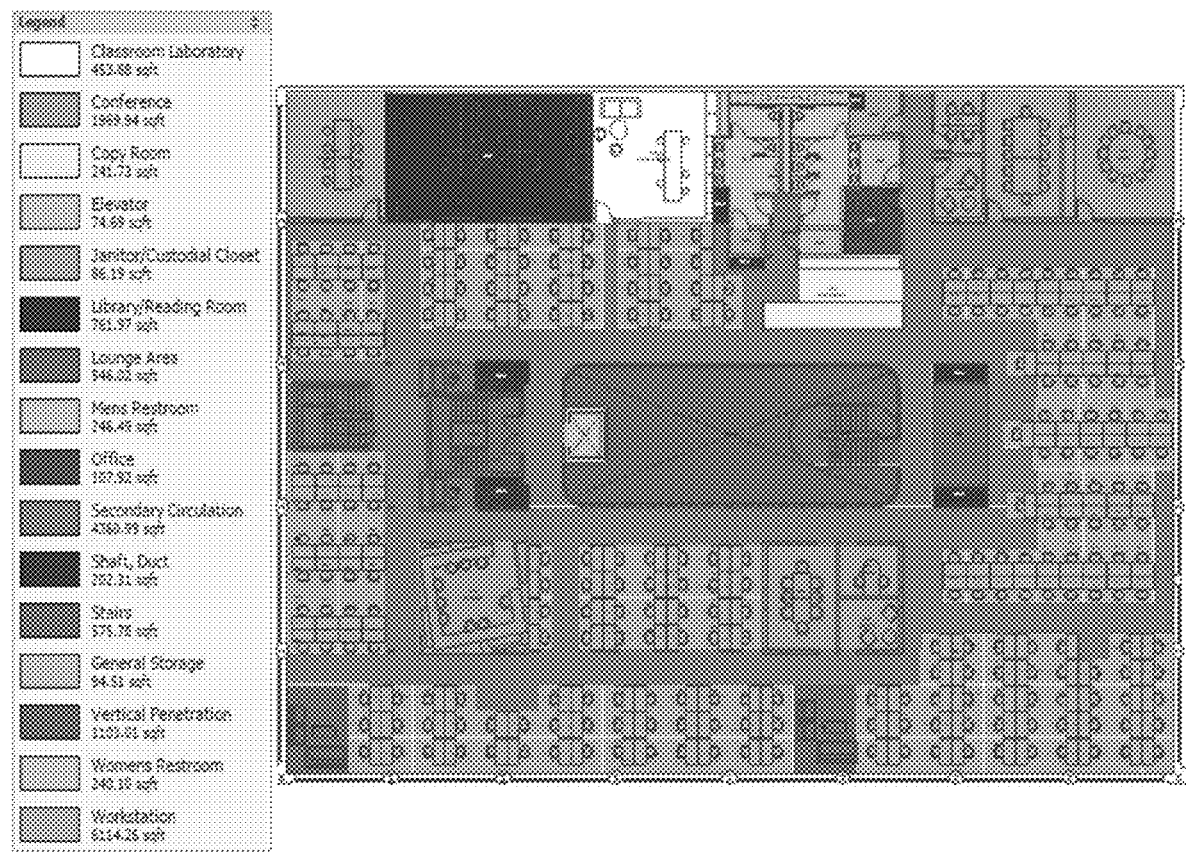
FIG. 1 shows an example of a prior art that utilizes a color-coded polylined map as a conventional method of office space management.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of descriptions of shapes, configurations, and/or other symbolic representations that directly or indirectly resemble one or more dynamic spatial clustering construction and visualization systems and methods of operating such systems. These descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention does not inherently indicate any particular order nor imply any limitations in the invention.

For the purpose of describing the invention, a term herein referred to as "space anchor point" is defined as a computer graphics-generated spatial point of geographic reference on an office floorplan represented in a synthesized computer visualization environment. In a preferred embodiment of the invention, a space anchor point serves as an initial geographic reference point prior to grouping of multiple anchor points and a space block size determination, which lead to a dynamic spatial clustering construction involving one or more grouped anchor points for the office floorplan. Furthermore, each space anchor point is associated with one or more "grouping properties," such as department allocations, current space types, notable spatial features per anchor point, etc., that serve as input parameters for machine-determined coherent grouping of anchor points for constructing a dynamic spatial clustering map on the office floorplan.

Moreover, for the purpose of describing the invention, a term herein referred to as "space marker icon" is defined as a symbolic spatial object located near a space anchor point, wherein the space marker icon serves as a virtualized handle for accessing and/or modifying "space properties," which may include a current space block size, a list of associated or grouped space anchor points, and any pertinent organizational or spatial characteristics involving the space marker icon. In a preferred embodiment of the invention, the space marker icon may be a square, a rectangle, a circle, or another geometrical shape, with its center or another location containing at least one space anchor point. In another embodiment of the invention, the space marker icon does not necessarily contain a space anchor point. Furthermore, the boundaries of the space marker icon may symbolize or be proportional to the approximate dimension of a space represented by the space anchor point.

In addition, for the purpose of describing the invention, a term herein referred to as "space" is defined as business, corporate, and/or academic premises that may be utilized by one or more group of people. For example, a "space" may be a conference room, a private office, a cubicle area, an auditorium, or a lunch room in a corporate building.

Furthermore, for the purpose of describing the invention, a term herein referred to as a "module" is defined as a specialized logical component comprising one or more software and/or chip-encoded hardware logical units that perform special-purpose task(s) and function(s) to enable specialized functionalities in a dynamic spatial clustering construction and visualization system.

One aspect of an embodiment of the present invention is providing a dynamic spatial clustering construction process executed by a dynamic spatial clustering construction and visualization system.

Furthermore, another aspect of an embodiment of the present invention is providing a dynamic spatial clustering construction and visualization system, which is configured to determine optimal spatial allocations, reallocations, and clustering (i.e. grouping) of various portions of an office floorplan based on organizational, space type, and/or spatial feature characteristics that are loaded into the system as input parameters. Preferably, the dynamic spatial clustering construction and visualization system is able to determine optimal spatial arrangements and grouping autonomously and intelligently, even without requiring human-initiated selection and assignment of spaces.

Yet another aspect of an embodiment of the present invention is providing a method of operating a dynamic spatial clustering construction process and a dynamic spatial clustering construction and visualization system.

Proactive physical space management is becoming an integral component of improving worker productivity and reducing unnecessary office leasing costs in recent years. Space management typically involves identifying various spaces in a workplace, tracking various properties associated with such spaces, and allocating or assigning specific spaces to appropriate business units and individuals.

Existing methods of space management include office management software, which is often part of an IWMS (Integrated Workplace Management System) solution.

These conventional software offerings are either on-premise software or cloud-based solutions, such as the ones provided by IBM Tririga, FM:Systems, SerraView, and iOffice. These existing software methods of space management typically rely on an area color-coding process generally referred to as "polylining," to identify and visualize the outlines of spaces.

CAD drawings that are typically utilized to direct construction or indicate furniture plans do not explicitly identify individual spaces, such as rooms, cubicles, and bench desks. Conventional CAD drawings of floorplans are typically read and interpreted by a human, who can perceive, for example, that a specific set of four walls and a door define a room. In contrast, a conventional floorplan-displaying CAD computer software is typically unable to identify the same four walls and the door as the room. Identifying boundaryless spaces, such as cubicles and bench desks, is even more difficult for the conventional CAD software to determine correctly.

Polylining is thus used to explicitly identify for a computer program the boundaries of various spaces. A typical polylining process involves adding a new layer to a CAD file which includes a specific floor plan. In this layer, a human user traces the outline of each space and assigns an identifying name or a number to each space. In some cases, identifying names or numbers may be included in a separate layer. With this method, a separate, closed polygon is created for each room, cubicle, bench desk, etc. These polygon objects can then be utilized by a software program as representations of individual spaces based on inscriptions on the floor plate layer.

FIG. 1 shows an example (100) of a prior art that utilizes a color-coded polylined map as a conventional method of office space management. As shown in this example, a polylining computer program can color all spaces based on their departmental allocations (e.g. marketing in green, sales in yellow, etc.) to visually indicate which spaces are allocated to which department. This is typically used to show high-level allocation of blocks of space.

However, polylining is a time-consuming and tedious process involving manual human labor, which drives up the cost of floorplan management operations and related software offerings. In particular, polylining requires updating the polyline layer and re-submitting the CAD file to the space management program whenever spaces are adjusted (e,g. when new desks are added, cubicles are relocated, etc.).

Therefore, a dynamic spatial clustering construction and visualization system, which is configured to autonomously determine optimal spatial allocations, reallocations, and clustering (i.e. grouping) of various portions of an office floorplan based on organizational, space type, and/or spatial feature characteristics, may provide substantial advantages to the office floorplan management software solutions. This novel approach is especially beneficial in improving management efficiencies and reducing related costs if the dynamic spatial clustering construction and visualization system is able to determine optimal spatial arrangements and grouping autonomously and intelligently, without requiring human-initiated selection and assignment of spaces.

Various embodiments of the present invention describe a dynamic spatial clustering construction process, a dynamic spatial clustering construction and visualization system, and a related method of operating the system. In general, these embodiments of the invention significantly improve the efficiency of space utilization and office floorplan management, while also reducing the costs associated with unoptimized and wasteful office space assignments and unnecessary manual human interventions in office floorplan management.

FIG. 2 shows an embodiment (200) of a space anchor point (201) and a dynamically-adjustable space marker icon (203) surrounded by one or more space marker boundary indicators (205A, 205B, 205C, 205D) synthesized in the dynamic spatial clustering construction and visualization system, in accordance with an embodiment of the invention. The space anchor point (201) may be positioned near the center of the dynamically-adjustable space marker icon (203) and the space marker boundary indicators (205A~205D), as shown in FIG. 2. In a preferred embodiment of the invention, a particular space in the dynamic spatial clustering construction and visualization system can be represented by a single anchor point (e.g. 201 in FIGS. 2, and 401, 403, and 405 in FIG. 4), which is typically located at the putative center of the space.

Once the space anchor point (201) is created and positioned, the dynamically-adjustable space marker icon (203) representing an area around the space anchor point (201) is then placed near the space anchor point (201). Furthermore, in the preferred embodiment of the invention, one or more space marker boundary indicators (i.e. 205A, 205B, 205C, 205D) may be generated near the boundaries of the dynamically-adjustable space marker icon (203) to suggest the approximate scale and the spaciousness of the area represented by the dynamically-adjustable space marker icon (203). Shapes and/or precise placements of the dynamically-adjustable space market icon (203) can be various, and the icon's placement may typically indicate a spatial relationship to the space anchor point (201) for clarity. Once created and placed into the particular space near the space anchor point (201), the dynamically-adjustable space marker icon (203) then serves as a virtual handle for accessing and editing space objects and their related properties.

FIG. 3 shows a tabular example (300) of grouping properties associated with each space anchor point for dynamic spatial clustering construction and visualization, in accordance with an embodiment of the invention. The dynamic spatial clustering construction and visualization system can dynamically correlate a particular space anchor point (e.g. 201, 202, 205, 301) with one or more grouping properties, such as "Department Allocation," "Current Space Type," and "Notable Spatial Features," as shown in the tabular example (300) in FIG. 3.

For example, Anchor Point #202 has a first grouping property (i.e. "Department Allocation") assigned to "Marketing Department," a second grouping property (i.e. "Current Space Type") associated with "cubicles and workstations," and a third grouping property (i.e. "Notable Spatial Features") describing the anchor point location being "adjacent to the kitchen and the atrium," as illustrated in FIG. 3. Likewise, in another example, Anchor Point #205 has the first grouping property (i.e. "Department Allocation") assigned to "Engineering Department," the second grouping property (i.e. "Current Space Type") associated with a "leaded wall laboratory," and the third grouping property (i.e. "Notable Spatial Features") describing the anchor point location being "adjacent to stairs," as also illustrated in FIG. 3.

In the preferred embodiment of the invention, a system operator is empowered to create or define desirable grouping properties and dynamically link them to one or more space anchor points. In another embodiment of the invention, the dynamic spatial clustering construction and visualization system can autonomously create a plurality of space anchor points for a targeted floor plan, determine useful grouping properties for the plurality of space anchor points, and automatically and intelligently fill in the grouping property contents (e.g. "Engineering Dept." for the Department Allocation Grouping Property, "Conference Room" for the Current Space Type Grouping Property, "Adjacent to Stairs" for the Notable Spatial Features Grouping Property, etc.) based on autonomous machine interpretation of the targeted floor plan and organizational parameters accessed from an office space planning resource database or another pertinent computerized information storage.

Figure 4:
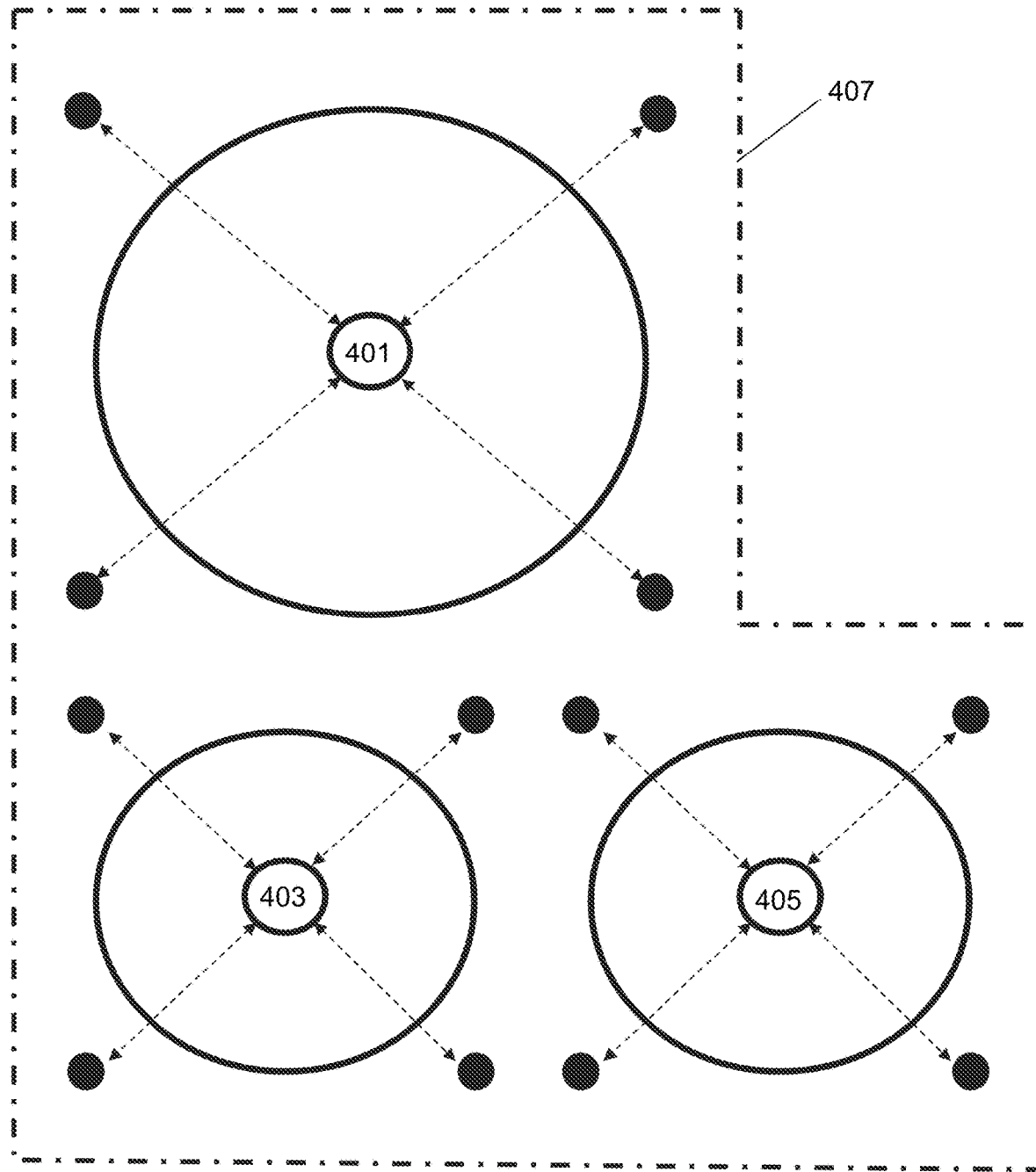
FIG. 4 shows an example of dynamic space anchor point grouping in a dynamic spatial clustering construction and visualization system, in accordance with an embodiment of the invention.

FIG. 4 shows an example (400) of dynamic space anchor point grouping in a dynamic spatial clustering construction and visualization system, in accordance with an embodiment of the invention. Each space anchor point (401, 403, 405) in this example (400) is surrounded by a corresponding space marker icon, wherein the space anchor point is typically at the putative center of the space. This anchor point does not need to be contained in a native CAD file for a floor plan, and can be synthesized and overlayered separately in a dynamic spatial clustering construction and visualization system user interface.

In this example, the three space anchors (401, 403, 405), their corresponding space marker icons, and space marker boundary indicators constitute a coherent spatial group (407) based on one or more common grouping properties associated with each space anchor point. The boundary of a coherent spatial group (407) suggests the approximate scale and the spaciousness of the area represented by a plurality of space marker icons and space marker boundary indicators. In the preferred embodiment of the invention, the coherent spatial group (407) may be color-coded or shade-coded within a floor plan displayed by the dynamic spatial clustering construction and visualization system. Creating or modifying one or more coherent spatial group arrangements (i.e. 407) based on one or more desirable grouping properties in an office floor plan is part of a "spatial clustering" process that can be dynamically synthesized and autonomously machine-determined by the dynamic spatial clustering construction and visualization system.

Figure 5B:
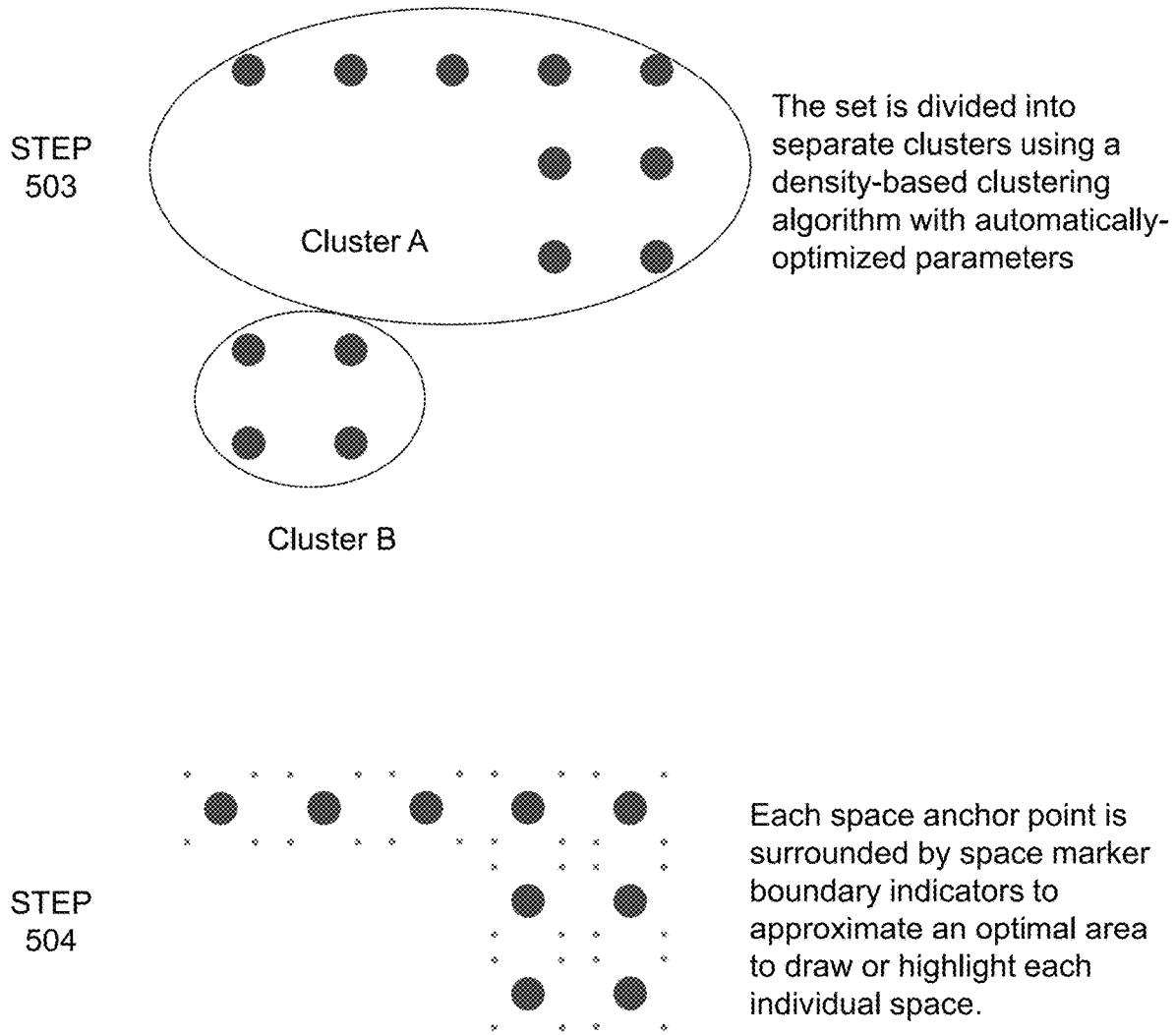
Figure 5C:
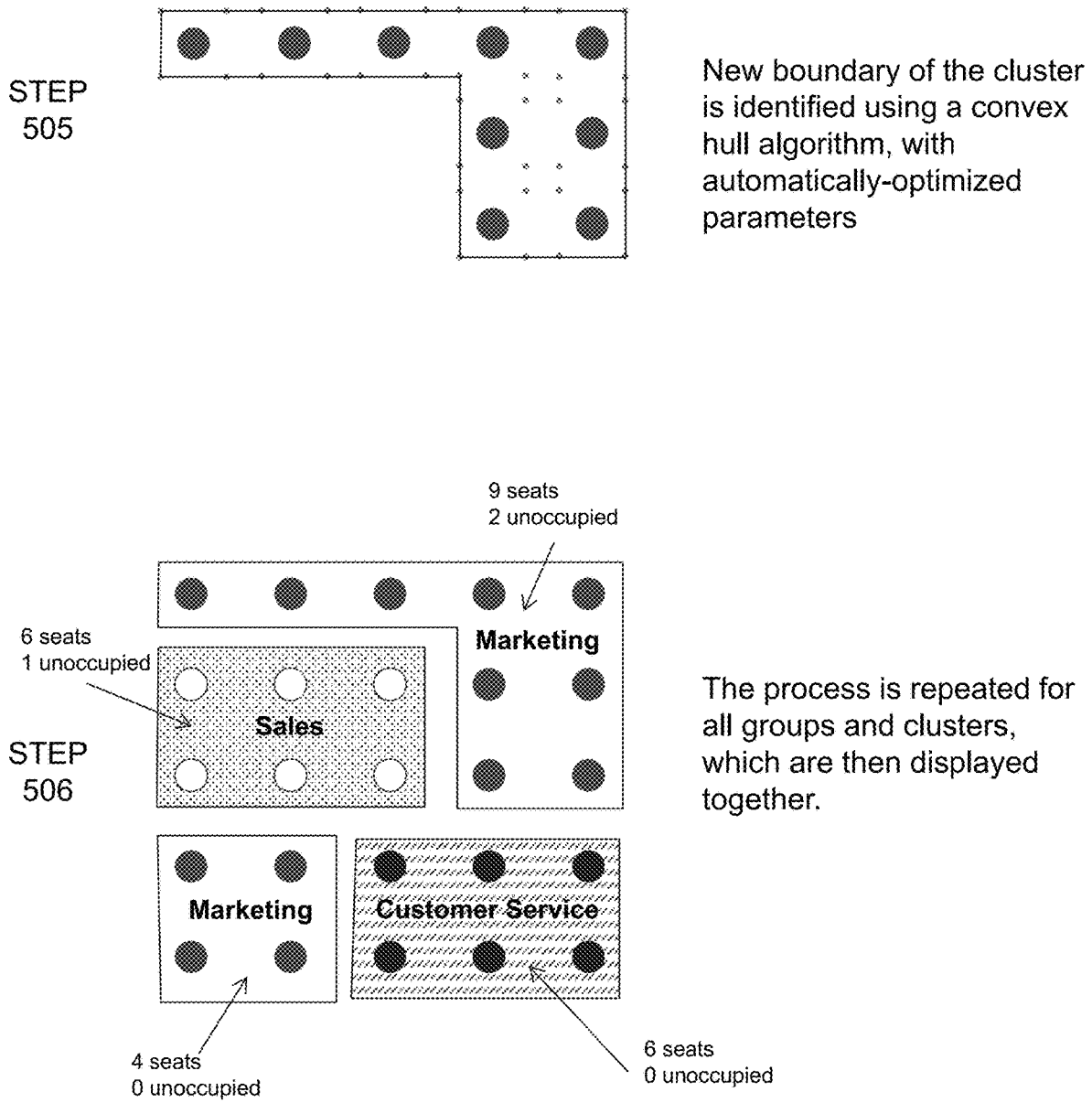

FIGS. 5A-5C show a sequential walk-through example of dynamic spatial clustering and visualization performed autonomously by an intelligent machine in six steps (STEPs 501~506), in accordance with an embodiment of the invention. As illustrated in STEP 501 in FIG. 5A, in this walk-through example (500A), spaces are represented by round space marker icons on a segment of a floor plan. Icon colors and/or shades indicate different grouping properties, or a combination of grouping properties. For instance, the Marketing Department may be represented as black icons, while the Sales Department and the Customer Service Department may be represented as white icons and gray icons, respectively. Other than organizational departments that may characterize certain grouping properties, desk types (e.g. cubicle vs. bench desk), equipment types (e.g. seat/stand desk vs. standard desks), notable spatial features (e.g. adjacent to atrium, adjacent to stairs), and other common traits among different parts of the segment of the floor plan can be symbolized by same icon colors or shades.

Then, as shown in STEP 502, each set of objects represented by round space marker icons with the same color and/or shade is isolated from other objects that do not have common grouping properties. For example, black round icons representing the Marketing Department are isolated from other colored or shaded icons representing other departments (e.g. Sales, Customer Service, etc.) in the organization, as illustrated in STEP 502 in FIG. 5A.

Subsequently, as shown in STEP 503 in FIG. 5B as part of the continued walk-through example (500B), the isolated black round icon objects representing the Marketing Department are then divided into separate clusters using a density-based clustering algorithm, which automatically optimizes parameters based on organizational or operator preferences for office space planning. Then, each space anchor point, symbolized by a corresponding black round icon object in STEP 504 in FIG. 5B, is surrounded by space marker boundary indicators that represent an optimal area to draw to highlight each individual space. In the preferred embodiment of the invention, the dynamic spatial clustering construction and visualization system, even without an operator instruction, autonomously determines and places the space marker boundary indicators to achieve best space and/or organizational efficiencies, while reducing unnecessary and potential spatial waste during the machine-performed spatial clustering process for multiple groups with common grouping properties on a computerized office floor plan.

Continuing with the walk-through example illustrated in FIGS. 5A-5C, FIG. 5C shows the continued walk-through example (500C) for the last two remaining steps of dynamic spatial clustering and visualization. In STEP 505, the new boundary of the cluster is identified using a convex hull algorithm, which provides an elastic-band-like tight formation of required boundaries for optimal space efficiency for a specific cluster of grouped icons based on common traits, as illustrated in FIG. 5C. Furthermore, STEPs 501-505 can be repeated for all space anchor/space marker icon groups identified with common traits on the computerized office floor plan for multiple dynamic spatial clustering constructions, as shown in STEP 506.

The dynamic spatial clustering construction and visualization system's intelligent machine determination of optimal spatial clustering for various space anchor and space marker icon groups reduces chances of inadvertently wasted spaces and human errors in floor planning assignments that may negatively impact the operational efficiency of the organization. In the preferred embodiment of the invention, the dynamic spatial clustering construction and visualization system does not require a human operator intervention to input step-by-step instructions or floor plan map manipulations into the system. Instead, the dynamic spatial clustering construction and visualization system is capable of autonomously and intelligently determining optimal spatial clustering from a given set of space segments, grouping properties, and geographic features of a computerized office floor plan, by machine-determined isolation and sub-grouping of space marker icons based on known common traits per icon (i.e. STEP 501 and STEP 502), by determining separate clusters within each subgroup, if necessary, using a density-based clustering algorithm (i.e. STEP 503), by creating space marker boundary indicators to approximate required spaces without spatial waste (i.e. STEP 504), and by executing a convex hull algorithm on each defined cluster to determine the new boundary per cluster without spatial waste within the computerized office floor plan (i.e. STEP 505).

In case of the continued walk-through example (500C) in FIG. 5C, the completed spatial clustering for the computerized office floor plan by the dynamic spatial clustering construction and visualization system created four clusters, with two Marketing Department clusters, a Sales Department cluster, and a Customer Service cluster, as illustrated in STEP 506. Preferably, the dynamic spatial clustering construction and visualization system utilizes color coding to indicate different type of clusters, with the same color coding in one or more clusters signifying desired common traits in cluster types. In the example shown in STEP 506, the two Marketing Department clusters are visualized with the same color coding, while the other clusters are coded with different colors. In some embodiments of the invention, shade-coding can be utilized instead of color coding. Furthermore, the dynamic spatial clustering construction and visualization system is configured to track important asset quantities and their availabilities per cluster. Other pertinent information related to each machine-determined optimal "space block cluster" that share common grouping traits or useful information per cluster can also be displayed by the dynamic spatial clustering construction and visualization system. Examples of useful information per cluster include, but are not limited to, costs per cluster, proportions of rent per cluster, and average noise level per cluster. In the continued walk-through example (500C) in FIG. 5C, the total number of seats and the unoccupied seat availability status are visualized for each cluster, as shown in STEP 506.

In the preferred embodiment of the invention, the dynamic spatial clustering construction and visualization system comprises a central processing unit, a graphics processing unit, a memory unit, an input/output peripheral interface, a data storage unit, and a power management unit to make autonomous decisions for creating one or more optimal space block clusters after executing various autonomous machine-determined steps from STEPs 501-506, and graphically rendering results for human viewing. The graphically-rendered results, including synthesized space block clusters generated and/or superimposed on the computerized office floor plan as a result of the dynamic spatial clustering construction, can then be visualized on a display panel connected to the dynamic spatial clustering construction and visualization system.

Furthermore, in order to identify groups of related and adjacent spaces, the preferred embodiment of the invention utilizes a novel multi-step combination of algorithms and floor-related parameters to cluster spaces and to define the combined boundaries of the clusters in order to display them as a single-block cluster.

In the preferred embodiment of the invention, this process includes the following steps:

1. As an input, a list of space anchor points, with at least one grouping property indicated (e.g. department allocation, space type, etc.)
2. Grouping space anchors based on the desired shared property (e.g. department allocation, space type, etc.)
3. Executing a density-based spatial clustering of applications with noise algorithm to identify groups of adjacent, similar spaces. This invention provides an intelligent machine's autonomous determination and optimization of key parameters for the algorithm to produce a useful result. These parameters may include the following information:

a) A minimum number of spaces required, which is quantified by the number of space anchor points and/or the number of corresponding space marker icons, in order to create a block.

b) The clustering radius argument, which controls which spaces are close enough to create or be included in the same space block, is automatically set as a weighted combination of an objective parameter (pixels per foot, pixel per meter, or other scale parameters used in rendering the current image) and a subjective parameter (the size of the icon used to identify spaces).

For example, a marketing office on one side of a floor will not be a part of a group of cubicles that's at the other end of the floor. A more subtle condition is when spaces are across the aisle from each other and need to be assigned either to the same space block or two different blocks, as exemplified by STEP 503 in FIG. 5B.

4. To enable optimal visualization, each space anchor point in any given cluster is enhanced or replaced by one or more space marker boundary indicators that surround a space marker icon in a particular geometrical shape (e.g. square, rectangle, circle, etc.). As shown in FIG. 2 and FIG. 4, a space marker icon may keep the space anchor point as its center. Preferably, a space marker boundary indicator in this visualization scheme may be a function of the size of the space marker icon.

5. A convex hull algorithm is executed against these space marker boundary indicators for each cluster to generate the outline of the space block. As exemplified by STEP 505 in FIG. 5C and FIG. 8, convex hulls are a mathematical concept for the smallest convex set containing a given set of points in a Euclidean plane. For a finite set of points, one can think of the convex hull as the shape of a rubber band snapped around the set of points or algorithms in a planar, Euclidean space, wherein the convex hull is utilized to identify of a minimal convex curve that encompasses a given set of points. In contrast, conventional algorithms are designed to identify the minimal curve encompassing a set of points, and thus do not provide for the desired visualization by space planners, as illustrated by FIG. 7. A key parameter in controlling the visualization is a concavity parameter, which determines how edges and corners are traced around the cluster. Uniquely in this invention, the concavity parameter of the algorithm is automatically optimized as a function of the scale of the rendered image and the size of the space marker icon (e.g. pixels per foot or per meter).

6. The resulting outline is drawn on the screen on a floor plan with the same scale (pixels per foot or meter) providing an optimal visualization, as shown in STEP 505 in FIG. 5C.

7. The dynamic spatial clustering and visualization steps shown in STEPs 501-505 in FIGS. 5A-5C are iterated for a plurality of identified and grouped clusters of space anchor points in a computerized office floorplan to create a novel spatial clustering visualization map, optionally with additional information per cluster, as shown in STEP 506 of FIG. 5C.

The outcome is a computer process which, by using non-traditional objective and subjective parameters that are application and zoom-level specific, automatically adapts to changes in space grouping parameter's value (e.g. as when a space's allocation changes from Marketing Dept. to Sales Dept.), or when the parameter on which the grouping is defined is changed (e.g. creating blocks by space allocation vs by space type). These seven-step processes, in the preferred embodiment of the invention, are executed in the dynamic spatial clustering construction and visualization system as core logics of autonomous machine-derived decisions (i.e. without detailed human operator guidance or instructions) for creating one or more optimal space block clusters. Preferably, the one or more optimal space block clusters are then rendered and superimposed on the computerized office floor plan as a result of the machine-determined dynamic spatial clustering construction, which can be visualized in a display panel connected to the dynamic spatial clustering construction and visualization system.

Figure 6:
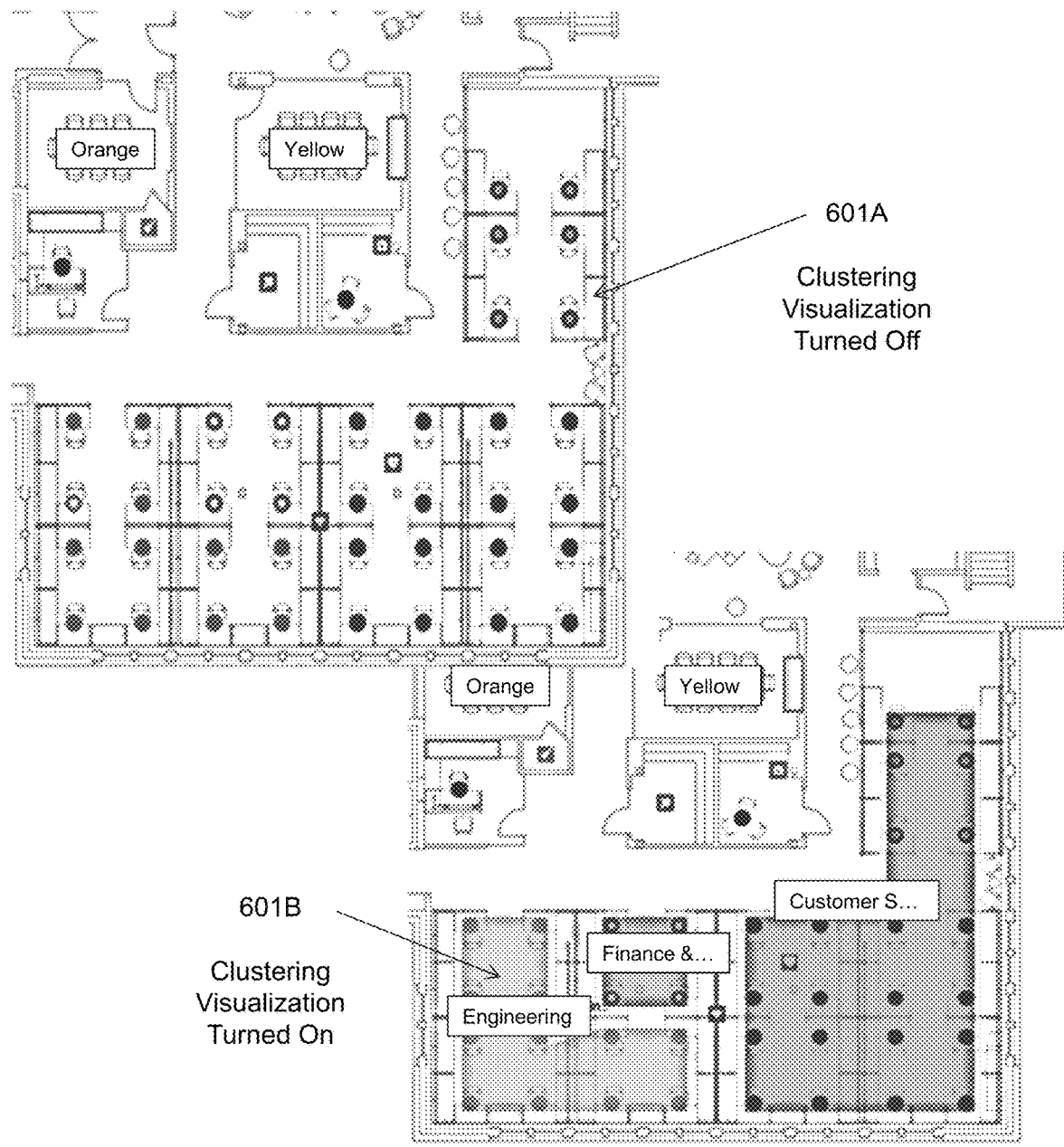
FIG. 6 shows a dynamic spatial clustering and visualization screenshot for an office floorplan generated in a dynamic spatial clustering construction and visualization system, in accordance with an embodiment of the invention.

FIG. 6 shows dynamic spatial clustering and visualization snapshots (600) of a computerized office floorplan generated from a dynamic spatial clustering construction and visualization system, in accordance with an embodiment of the invention. The upper snapshot (601A) is a plain version of the computerized office floorplan with the clustering visualization turned off in the system user interface, which still shows a plurality of color-coded anchor points and space marker icons after common-trait grouping and clustering in the office floorplan map through the autonomous machine-determined dynamic spatial clustering process, as previously described in conjunction with various processing steps (i.e. STEPs 501-506) in FIG. 5A-5C. In contrast, the lower snapshot (601B) is a clustering-visualized version of the computerized office floorplan with the clustering visualization turned on in the system user interface, which shows color-coded spatial clusters categorized by common grouping properties and traits (e.g. Engineering Dept., Customer Service Dept., Finance Dept., etc.).

FIG. 7 shows examples (700) of conventional (i.e. prior art) node-grouping methods with some notable shortcomings, in accordance with an embodiment of the invention. In particular, conventional attempts to outline a cluster of points in a Euclidean plane (1 and 2 in FIG. 7) often run into inadvertently creating overlapping regions, unclear clusters, and ambiguous boundaries (3 in FIG. 7), and hence does not enable effective dynamic spatial clustering construction and visualization. Therefore, various machine-determined steps and processes as embodied, for example, in FIGS. 5A-5C and FIG. 9 of the present invention critically enable novel and autonomous machine-determined dynamic spatial clustering construction and visualization, which the prior art methods utterly failed to achieve.

Figure 8:
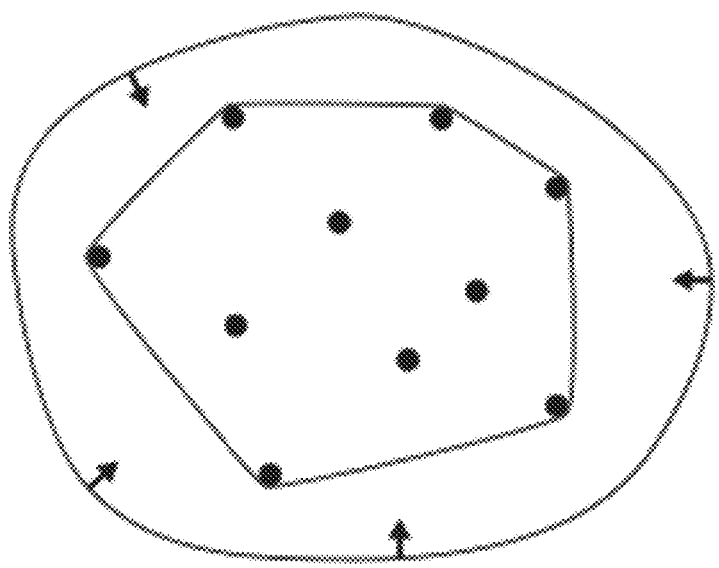
FIG. 8 shows a diagram example that utilizes a convex hull algorithm to generate an outline of a space block cluster, in accordance with an embodiment of the invention.

FIG. 8 shows a diagram example (800) that utilizes a convex hull algorithm to generate an outline of a space block cluster, in accordance with an embodiment of the invention. The convex hull algorithm can be executed against space marker boundary indicators for each cluster to generate the outline of the space block. Convex hulls are a mathematical concept for the smallest convex set containing a given set of points in a Euclidean plane.

For a finite set of points, one can think of the convex hull as the shape of a rubber band snapped around the set of points or algorithms in a planar, Euclidean space, wherein the convex hull is utilized to identify of a minimal convex curve that encompasses a given set of points. A key parameter in controlling the visualization is a concavity parameter, which determines how edges and corners are traced around the cluster. Uniquely in this invention, the concavity parameter of the algorithm is automatically optimized as a function of the scale of the rendered image and the size of the space marker icon (e.g. pixels per foot or per meter).

Figure 9:
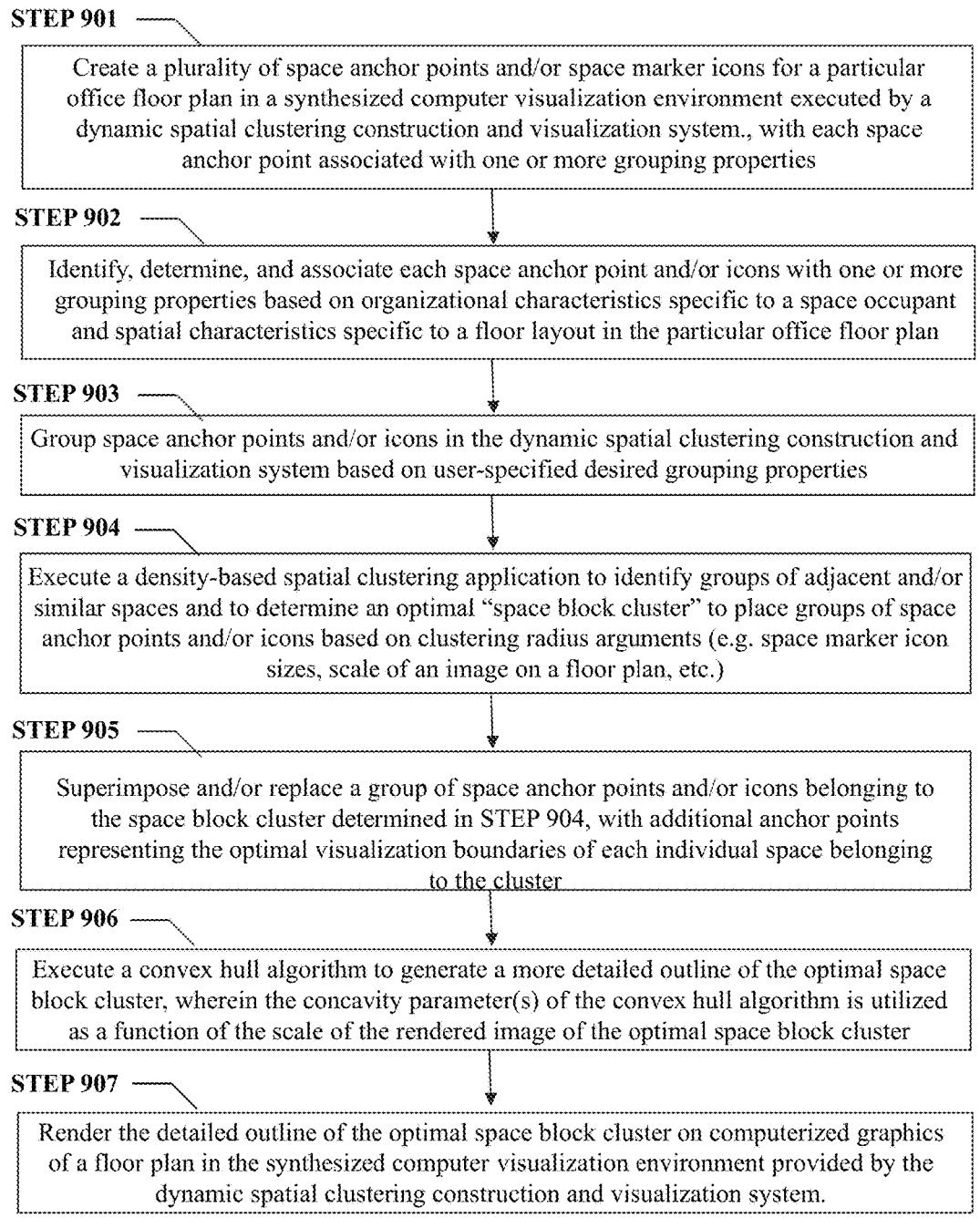
FIG. 9 shows an operational flowchart for a dynamic spatial clustering construction process executed by a dynamic spatial clustering construction and visualization system, in accordance with an embodiment of the invention.

FIG. 9 shows an operational flowchart (900) for a dynamic spatial clustering construction process executed by a dynamic spatial clustering construction and visualization system. STEPs 901~907 show a preferred embodiment of this dynamic spatial clustering construction process. As a first step, the dynamic spatial clustering construction and visualization system creates a plurality of space anchor points for a particular office floor plan in a synthesized computer visualization environment, with each space anchor point associated with one or more grouping properties, as shown in STEP 901.

Then, the dynamic spatial clustering construction and visualization system identifies, determines, and associates each space anchor point with one or more grouping properties based on organizational characteristics specific to a space occupant and spatial characteristics specific to a floor layout in the particular office floor plan, as shown in STEP 902. The dynamic spatial clustering construction and visualization system is then able to group space anchor points based on user-specified desired grouping properties, or based on common traits among the space anchor points, as shown in STEP 903.

Once the space anchor points are grouped in one or more multiple pieces based on desired common grouping properties or traits, the dynamic spatial clustering construction and visualization system executes a density-based spatial clustering application to identify groups of adjacent and/or similar spaces and to determine an optimal "space block cluster" to place groups of space anchor points based on clustering radius arguments (e.g. space marker icon sizes, scale of an image on a floor plan, etc.), as shown in STEP 904. Then, the dynamic spatial clustering construction and visualization system is able to superimpose and/or replace a group of space anchor points with the optimal space block cluster that are newly determined in STEP 904, wherein the optimal space block cluster is initially represented by a rectangle or by another shape, as shown in STEP 905.

The dynamic spatial clustering construction and visualization system can then execute a convex hull algorithm to generate a more detailed outline of the optimal space block cluster, wherein the concavity parameters of the convex hull algorithm are utilized as a function of the scale of the rendered image of the optimal space block cluster, as shown in STEP 906. As a final step, the dynamic spatial clustering construction and visualization system is then able to render and display the detailed outline of the optimal space block cluster on computerized graphics of a floor plan in the synthesized computer visualization environment provided by the system, as shown in STEP 907.

This automatic clustering approach also enables automatic display of aggregate information associated with the clusters, which are not provided by prior art methods of coloring polylined spaces. Because the dynamic spatial clustering construction and visualization system, if designed in accordance with an embodiment of the present invention, knows which spaces are clustered together, intelligent and autonomous machine-determined calculations and display of dynamically-associated informative parameters (e.g. the number of spaces included in the cluster, their total area, the number of people seated the cluster, the number of empty seats, etc.) can be readily incorporated into the spatial clustering visualization map rendered by the dynamic spatial clustering construction and visualization system.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the claims presented herein.

What is claimed is:

1. A method for dynamic spatial clustering construction and visualization for office space planning of an organization, the method comprising the steps of:

graphically rendering a plurality of space anchor points and space marker icons for a particular office floor plan in a synthesized computer visualization environment provided by a dynamic spatial clustering construction and visualization system;

identifying, determining, and associating each space anchor point with one or more grouping properties, based on organizational characteristics specific to a space occupant and spatial characteristics specific to a floor layout in the particular office floor plan;

creating groups from the plurality of space anchor points in the dynamic spatial clustering construction and visualization system based on user-specified desired grouping properties, wherein each group contains one or more space anchor points with common traits indicated by the user-specified desired grouping properties;

executing a density-based spatial clustering application in the dynamic spatial clustering construction and visualization system to identify one or more groups of nearby spaces and to determine an optimal "space block cluster" that represents a space-efficient and non-overlapping spatial clustering formation with the common traits within the organization, based on clustering radius arguments that include at least one of a space marker icon size and a scale of an image on the particular office floor plan;

superimposing or replacing a subset of the plurality of space anchor points contained in the one or more groups of nearby spaces with the optimal "space block cluster," which is graphically rendered as a polygon or another computer graphical shape on a display panel connected to the dynamic spatial clustering construction and visualization system;

executing a convex hull algorithm in the dynamic spatial clustering construction and visualization system to determine a more detailed outline of the optimal "space block cluster," wherein one or more concavity parameters of the convex hull algorithm are utilized as a function of the scale of the image rendered as the optimal "space block cluster"; and synthesizing and graphically rendering the more detailed outline of the optimal "space block cluster" as computerized graphics on the particular office floor plan in the synthesized computer visualization environment provided by the dynamic spatial clustering construction and visualization system.

2. The method of claim 1, further comprising a step of displaying the more detailed outline of the optimal "space block cluster" as the computerized graphics rendered on the particular office floor plan in the synthesized computer visualization environment.

3. The method of claim 2, wherein the optimal "space block cluster" is color-coded and categorized by the one or more grouping properties or by the user-specified desired grouping properties, when displayed on the display panel connected to the dynamic spatial clustering construction and visualization system.

4. The method of claim 1, wherein the optimal "space block cluster" determined, synthesized, and rendered as the computerized graphics on the particular office floor plan is a resulting output of autonomous machine decisions involving multiple logical steps executed in the dynamic spatial clustering construction and visualization system.

5. The method of claim 1, wherein each space anchor point is accompanied by a space marker icon that positions each space anchor point in a putative center of the space marker icon.

6. The method of claim 5, wherein the space marker icon is further accompanied by one or more space marker boundary indicators near boundaries of the space marker icon to indicate an approximate scale and spaciousness of an area represented by the space marker icon.

7. The method of claim 1, wherein the one or more grouping properties include a department allocation for the organization, or at least one of a current space type and a notable spatial feature associated with the floor layout in the particular office floor plan.

8. The method of claim 1, wherein the optimal "space block cluster" includes visual indicators that display asset quantities and availabilities of assets per cluster.

9. The method of claim 8, wherein the asset quantities include a total number of seats or a total number of available equipment per space block cluster, and wherein the availabilities of assets per cluster include unoccupied seats or unused equipment statuses.

10. The method of claim 1, wherein the optimal "space block cluster" includes visual indicators that display costs per cluster, a proportion of rent per cluster, or an average noise level per cluster.

* * * * *